United States Patent
Camp et al.

(10) Patent No.: US 10,222,998 B2
(45) Date of Patent: Mar. 5, 2019

(54) BACKGROUND THRESHOLD VOLTAGE SHIFTING USING BASE AND DELTA THRESHOLD VOLTAGE SHIFT VALUES IN NON-VOLATILE MEMORY

(71) Applicant: International Business Machines Corporation, Armonk, NY (US)

(72) Inventors: Charles J. Camp, Sugar Land, TX (US); Timothy J. Fisher, Cypress, TX (US); Aaron D. Fry, Richmond, TX (US); Nikolas Ioannou, Zurich (CH); Ioannis Koltsidas, Zurich (CH); Nikolaos Papandreou, Thalwil (CH); Thomas Parnell, Zurich (CH); Roman A. Pletka, Uster (CH); Charalampos Pozidis, Thalwil (CH); Sasa Tomic, Kilchberg (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/804,975

(22) Filed: Nov. 6, 2017

(65) Prior Publication Data
US 2018/0059941 A1    Mar. 1, 2018

Related U.S. Application Data

(63) Continuation of application No. 15/405,162, filed on Jan. 12, 2017, now Pat. No. 9,864,523, which is a
(Continued)

(51) Int. Cl.
*G11C 16/10* (2006.01)
*G06F 3/06* (2006.01)
(Continued)

(52) U.S. Cl.
CPC ............ *G06F 3/061* (2013.01); *G06F 3/0655* (2013.01); *G06F 3/0688* (2013.01); *G11C 16/10* (2013.01);
(Continued)

(58) Field of Classification Search
CPC .................. G11C 16/10; G11C 16/26
(Continued)

(56) References Cited

U.S. PATENT DOCUMENTS 4,962,322 A * 10/1990 Chapman .............. G11C 11/404
                                                    257/315
5,357,459 A * 10/1994 Chapman .............. G11C 11/404
                                                    257/E27.081
(Continued)

FOREIGN PATENT DOCUMENTS

CN      101325089 A     12/2008
EP      1008936 A2      6/2000
(Continued)

OTHER PUBLICATIONS

List of IBM Patents or Patent Applications Treated as Related.
(Continued)

*Primary Examiner* — Michael Tran
(74) *Attorney, Agent, or Firm* — Zilka-Kotab, P.C.

(57) ABSTRACT

In one embodiment, a computer program product includes a computer readable storage medium having program instructions embodied therewith. The program instructions are executable by a processing circuit to cause the processing circuit to perform a method that includes determining, after writing data to a non-volatile memory block, one or more delta threshold voltage shift ($TVS_\Delta$) values. One or more overall threshold voltage shift values is calculated for the data written to the non-volatile memory block. The one or more overall threshold voltage shift values are stored. The
(Continued)

method also includes reading one or more TVS values from a non-volatile controller memory, and resetting a program/erase cycle count since last calibration after calibrating the one or more overall threshold voltage shift values. The one or more $TVS_\Delta$ values and the program/erase cycle count since last calibration are stored to the non-volatile controller memory.

15 Claims, 10 Drawing Sheets

Related U.S. Application Data continuation of application No. 14/987,724, filed on Jan. 4, 2016, now Pat. No. 9,583,205, which is a continuation of application No. 14/500,900, filed on Sep. 29, 2014, now Pat. No. 9,251,909.

(51) Int. Cl.
    G11C 16/34    (2006.01)
    G11C 16/26    (2006.01)
    G11C 29/02    (2006.01)
    G11C 16/14    (2006.01)
    G11C 29/04    (2006.01)

(52) U.S. Cl.
    CPC ............ *G11C 16/14* (2013.01); *G11C 16/26* (2013.01); *G11C 16/3427* (2013.01); *G11C 29/021* (2013.01); *G11C 29/028* (2013.01); *G11C 2029/0409* (2013.01)

(58) Field of Classification Search
    USPC ........................................ 365/185.02, 185.24
    See application file for complete search history.

(56) References Cited

U.S. PATENT DOCUMENTS

| | | | |
|---|---|---|---|
| 5,490,110 | A | 2/1996 | Sawada et al. |
| 6,259,627 | B1 | 7/2001 | Wong |
| 6,996,692 | B2 | 2/2006 | Kouno |
| 7,424,666 | B2 | 9/2008 | Chandwani et al. |
| 7,542,344 | B2 | 6/2009 | Kim |
| 7,545,677 | B2 | 6/2009 | Lee et al. |
| 7,808,836 | B2 | 10/2010 | Murin et al. |
| 7,957,187 | B2 | 6/2011 | Mokhlesi et al. |
| 8,281,220 | B2 | 10/2012 | Kitahara |
| 8,902,669 | B2 | 12/2014 | Yang et al. |
| 8,938,659 | B2 | 1/2015 | Wu et al. |
| 9,251,909 | B1 | 2/2016 | Camp et al. |
| 9,583,205 | B2 | 2/2017 | Camp et al. |
| 9,864,523 | B2 | 1/2018 | Camp et al. |
| 2007/0180328 | A1 | 8/2007 | Cornwell et al. |
| 2008/0192544 | A1 | 8/2008 | Berman et al. |
| 2009/0003073 | A1 | 1/2009 | Rizel et al. |
| 2009/0141563 | A1 | 6/2009 | Furnemont |
| 2009/0146068 | A1* | 6/2009 | Agarwal ................ G01T 1/026 250/370.07 |
| 2009/0323412 | A1 | 12/2009 | Mokhlesi et al. |
| 2009/0323423 | A1 | 12/2009 | Bloom et al. |
| 2010/0027342 | A1 | 2/2010 | Eun et al. |
| 2010/0257429 | A1 | 10/2010 | Noguchi |
| 2011/0216590 | A1 | 9/2011 | Eun et al. |
| 2011/0235431 | A1 | 9/2011 | Takagiwa |
| 2012/0060060 | A1 | 3/2012 | Danilak |
| 2012/0182810 | A1 | 7/2012 | Radke et al. |
| 2012/0236618 | A1 | 9/2012 | Lee et al. |
| 2012/0250415 | A1 | 10/2012 | Sharon et al. |
| 2012/0324299 | A1 | 12/2012 | Moshayedi |
| 2013/0124931 | A1 | 5/2013 | Chen |
| 2013/0163335 | A1 | 6/2013 | Kim et al. |
| 2013/0194865 | A1 | 8/2013 | Bandic et al. |
| 2013/0223155 | A1* | 8/2013 | Oowada ............. G11C 11/5642 365/185.22 |
| 2013/0227200 | A1 | 8/2013 | Cometti et al. |
| 2013/0297986 | A1 | 11/2013 | Cohen |
| 2013/0297988 | A1 | 11/2013 | Wu et al. |
| 2014/0040664 | A1 | 2/2014 | Hida et al. |
| 2014/0082440 | A1 | 3/2014 | Ho et al. |
| 2014/0126292 | A1 | 5/2014 | Yang et al. |
| 2014/0169095 | A1 | 6/2014 | Avila et al. |
| 2014/0237160 | A1 | 8/2014 | Dong |
| 2014/0269020 | A1 | 9/2014 | Song et al. |
| 2014/0304474 | A1 | 10/2014 | Reinhardt et al. |
| 2014/0331106 | A1 | 11/2014 | Baum et al. |
| 2014/0334228 | A1 | 11/2014 | Kim et al. |
| 2014/0379987 | A1 | 12/2014 | Aggarwal et al. |
| 2015/0008874 | A1* | 1/2015 | Sidorenko ............. H02J 7/0018 320/107 |
| 2015/0170746 | A1 | 6/2015 | Oowada et al. |
| 2016/0141048 | A1 | 5/2016 | Camp et al. |
| 2016/0172037 | A1 | 6/2016 | Lee |
| 2017/0098478 | A1 | 4/2017 | Lee et al. |
| 2017/0103815 | A1 | 4/2017 | Hsieh et al. |
| 2017/0117053 | A1 | 4/2017 | Sharon et al. |
| 2017/0123660 | A1 | 5/2017 | Camp et al. |
| 2017/0148524 | A1 | 5/2017 | Shibata |
| 2017/0186494 | A1 | 6/2017 | Kim et al. |
| 2018/0059940 | A1 | 3/2018 | Camp et al. |

FOREIGN PATENT DOCUMENTS

| | | |
|---|---|---|
| JP | 5203049 B2 | 6/2013 |
| KR | 20130088061 A | 8/2013 |

OTHER PUBLICATIONS

Camp et al., U.S. Appl. No. 15/804,933, filed Nov. 6, 2017.
Camp et al., U.S. Appl. No. 14/500,900, filed Sep. 29, 2014.
Notice of Allowance from U.S. Appl. No. 14/500,900, dated Sep. 22, 2015.
Chen et al., "Bias-induced oxygen adsorption in zinc tin oxide thin film transistors under dynamic stress," Applied Physics Letters 96, No. 26, Jun. 2010, pp. 262104-1-262104-3.
Gregori et al., "On-Chip Error Correcting Techniques for New-Generation Flash Memories," Proceedings of the IEEE, vol. 91, Issue 4, Apr. 2003, pp. 602-616.
Prince, B., "After DRAM—Some Novel Contenders," Emerging Memories: Technologies and Trends, Feb. 28, 2002, pp. 181-233.
Schmidt et al., "Heavy Ion SEE Studies on 4-Gbit NAND-Flash Memories," IEEE, Sep. 10-14, 2007, pp. 1-4.
Camp et al., U.S. Appl. No. 14/987,724, filed Jan. 4, 2016.
Non-Final Office Action from U.S. Appl. No. 14/987,724, dated Jun. 14, 2016.
Notice of Allowance from U.S. Appl. No. 14/987,724, dated Oct. 14, 2016.
Camp et al., U.S. Appl. No. 15/405,162, filed Jan. 12, 2017.
Non-Final Office Action from U.S. Appl. No. 15/405,162, dated Mar. 9, 2017.
Notice of Allowance from U.S. Appl. No. 15/405,162, dated Aug. 23, 2017.
Notice of Allowance from U.S. Appl. No. 15/405,162, dated Sep. 6, 2017.
Non-Final Office Action from U.S. Appl. No. 15/804,933, dated Jan. 2, 2018.
Non-Final Office Action from U.S. Appl. No. 15/804,933, dated May 9, 2018.
Notice of Allowance from U.S. Appl. No. 15/804,933, dated Oct. 12, 2018.

* cited by examiner

BACKGROUND THRESHOLD VOLTAGE SHIFTING USING BASE AND DELTA THRESHOLD VOLTAGE SHIFT VALUES IN NON-VOLATILE MEMORY

BACKGROUND

The present invention relates to Flash memory, and more particularly, this invention relates to background threshold voltage shifting using base and delta threshold voltage shift values in Flash memory.

The residual bit error rate (RBER) of a Flash memory block will typically increase over time due to additional program and erase cycling, charge leakage from retention, and additional charge placed in the cells by read operations (i.e., read disturb errors). Typically, a Flash memory block is retired when any page in the block exhibits a code word that reaches a page retirement error count limit. This limit is typically set to be achieved in conjunction with an appropriate error correction code (ECC), with the RBER for a Flash memory block being set to be similar to the RBER in traditional hard disk drives, e.g., at around $10 \times 10^{-15}$, but may be more or less.

Threshold voltage shifting, also known as block calibration, has been shown to be a key contributor to enhance endurance and retention for enterprise-level Flash memory systems using 19 nm and sub-19 nm NAND Flash memory. Preferably, the optimal threshold voltage shift values are determined shortly after a Flash memory block has been written. Unfortunately, this is not possible under a sustained heavy write workload without impacting data path performance. After initial writing, the threshold voltage shift values should be updated periodically as long as data remains on the Flash memory blocks. However, this would require significant additional read workload and data processing for every Flash memory block written, which is not acceptable in a Flash memory system.

Therefore, block calibration must be executed fully in the background and not in the data path. Executing Flash memory block calibration in this way, however, may result in some Flash memory blocks not being accurately calibrated. Those Flash memory blocks will exhibit a significantly higher RBER, which may result in unnecessary uncorrectable read errors or early and unwarranted Flash memory block retirement.

SUMMARY

In one embodiment, a computer program product includes a computer readable storage medium having program instructions embodied therewith. The computer readable storage medium is not a transitory signal per se. The program instructions are executable by a processing circuit to cause the processing circuit to perform a method that includes determining, by the processing circuit, after writing data to a non-volatile memory block, one or more delta threshold voltage shift ($TVS_A$) values configured to track temporary changes with respect to changes in the underlying threshold voltage distributions due to retention and/or read disturb errors. One or more overall threshold voltage shift values is calculated, by the processing circuit, for the data written to the non-volatile memory block, the one or more overall threshold voltage shift values being a function of the one or more $TVS_A$ values to be used when writing data to the non-volatile memory block. The one or more overall threshold voltage shift values are stored by the processing circuit. The method also includes reading, by the processing circuit, one or more TVS values from a non-volatile controller memory, and resetting, by the processing circuit, a program/erase cycle count since last calibration after calibrating the one or more overall threshold voltage shift values. The one or more $TVS_A$ values and the program/erase cycle count since last calibration are stored, by the processing circuit, to the non-volatile controller memory.

In another embodiment, a computer program product includes a computer readable storage medium having program instructions embodied therewith. The computer readable storage medium is not a transitory signal per se. The program instructions are executable by a processing circuit to cause the processing circuit to perform a method that includes determining, by the processing circuit, after the writing of data to a non-volatile memory block, one or more delta threshold voltage shift ($TVS_A$) values configured to track temporary changes with respect to changes in the underlying threshold voltage distributions due to retention and/or read disturb errors. One or more overall threshold voltage shift values is calculated, by the processing circuit, for the data written to the non-volatile memory block, the one or more overall threshold voltage shift values being a function of the one or more $TVS_A$ values to be used when writing data to the non-volatile memory block. The one or more overall threshold voltage shift values are stored, by the processing circuit. The method also includes grouping together, by the processing circuit, physical non-volatile pages which have similar $TVS_A$ values into a page group.

According to yet another embodiment, a computer program product includes a computer readable storage medium having program instructions embodied therewith. The computer readable storage medium is not a transitory signal per se. The program instructions are executable by a processing circuit to cause the processing circuit to perform a method that includes determining, by the processing circuit, after writing data to a non-volatile memory block, one or more delta threshold voltage shift ($TVS_A$) values configured to track temporary changes with respect to changes in the underlying threshold voltage distributions due to retention and/or read disturb errors. One or more overall threshold voltage shift values is calculated, by the processing circuit, for the data written to the non-volatile memory block, the one or more overall threshold voltage shift values being a function of the one or more $TVS_A$ values to be used when writing data to the non-volatile memory block. The one or more overall threshold voltage shift values are stored, by the processing circuit. Each overall threshold voltage shift value equals a sum of a corresponding base threshold voltage shift ($TVS_{BASE}$) value and a corresponding $TVS_A$ value, the $TVS_{BASE}$ value being configured to track permanent changes in underlying threshold voltage distributions due to cycling of the non-volatile memory block.

Other aspects and embodiments of the present invention will become apparent from the following detailed description, which, when taken in conjunction with the drawings, illustrate by way of example the principles of the invention.

DETAILED DESCRIPTION

Figure 1:
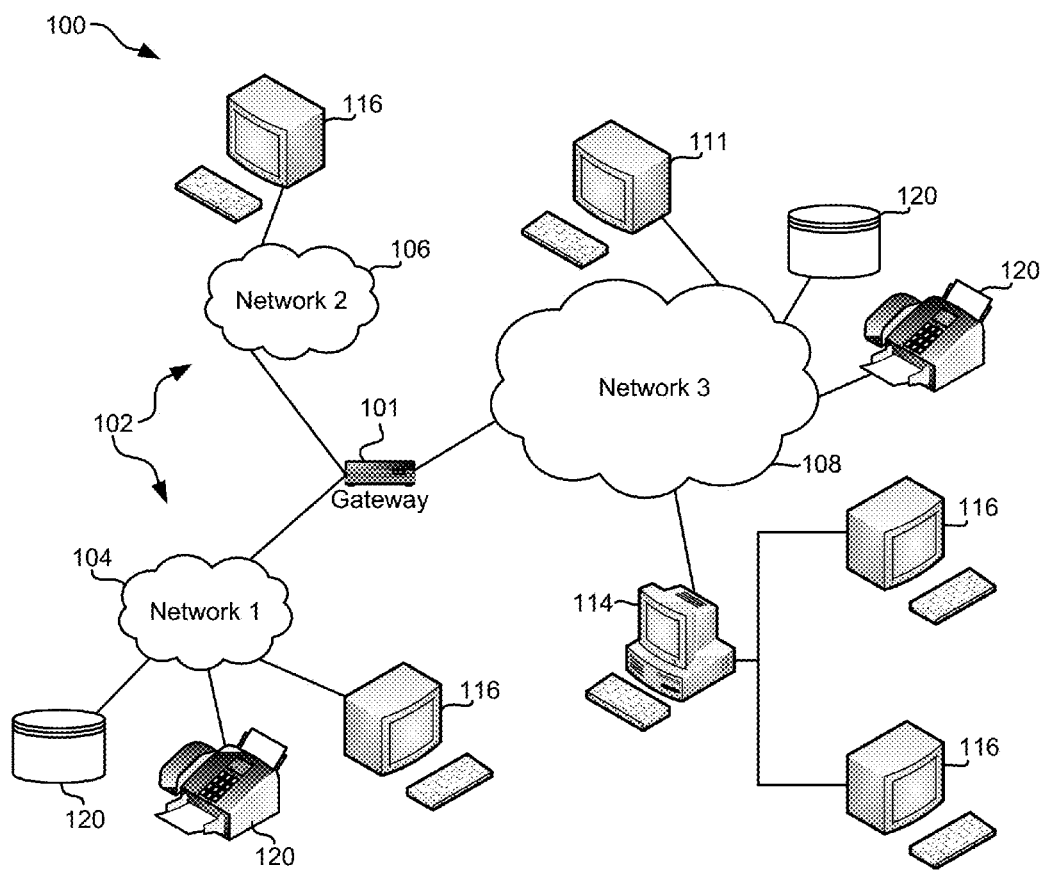
FIG. 1 illustrates a network architecture, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

According to one embodiment, the threshold voltage shift values may be separated into two components: 1) a base threshold voltage shift which tracks permanent changes in the underlying threshold voltage distributions due to cycling, and 2) delta threshold voltage shift values which adapt to temporary changes in the underlying threshold voltage distributions due to retention and/or read disturb errors.

The base and delta threshold voltage shift values may be adapted independent from each other in some cases and may be adapted simultaneously with one another in other cases. Upon block calibration, additional information may be used to decide whether the base and delta threshold voltage shift values should be updated or reset.

In one general embodiment, an apparatus includes a Flash memory block configured to store data and a processor and logic integrated with and/or executable by the processor, the logic being configured to: determine, after writing data to the Flash memory block, one or more base threshold voltage shift ($TVS_{BASE}$) values configured to track permanent changes in underlying threshold voltage distributions due to cycling of the Flash memory block, determine, after the writing of data to the Flash memory block, one or more delta threshold voltage shift ($TVS_\Delta$) values configured to track temporary changes with respect to changes in the underlying threshold voltage distributions due to retention and/or read disturb errors, calculate one or more overall threshold voltage shift values for the data written to the Flash memory block, the one or more overall threshold voltage shift values being a function of the one or more $TVS_{BASE}$ values and the one or more $TVS_\Delta$ values to be used when writing data to the Flash memory block, and apply the one or more overall threshold voltage shift values to a read operation of the data stored to the Flash memory block upon receiving a read request.

In another general embodiment, a method for managing threshold voltage shifts in Flash memory includes determining, by a processor after writing data to a Flash memory block, one or more $TVS_{BASE}$ values configured to track permanent changes in underlying threshold voltage distributions due to cycling of the Flash memory block, determining, by the processor after the writing of data to the Flash memory block, one or more $TVS_\Delta$ values configured to track temporary changes, with respect to changes in the underlying threshold voltage distributions due to retention and/or read disturb errors, calculating by the processor an overall threshold voltage shift value for the data written to the Flash memory block, the overall threshold voltage shift value being a function of the one or more $TVS_{BASE}$ values and the one or more $TVS_\Delta$ values to be used when writing data to the Flash memory block, and applying by the processor the overall threshold voltage shift value to a read operation of the data stored to the Flash memory block upon receiving a read request.

According to another general embodiment, a computer program product for managing threshold voltage shifts in Flash memory includes a computer readable storage medium having program instructions embodied therewith, the program instructions being readable and/or executable by a processor to cause the processor to: determine, by the processor after writing data to a Flash memory block, one or more $TVS_{BASE}$ values configured to track permanent changes in underlying threshold voltage distributions due to cycling of the Flash memory block, determine, by the processor after the writing of data to the Flash memory block, one or more $TVS_\Delta$ values configured to track temporary changes with respect to changes in the underlying threshold voltage distributions due to retention and/or read disturb errors, calculate, by the processor, an overall threshold voltage shift value for the data written to the Flash memory block, the overall threshold voltage shift value being a function of the $TVS_{BASE}$ value and the $TVS_\Delta$ value to be used when writing data to the Flash memory block, and apply, by the processor, the overall threshold voltage shift value to a read operation of the data stored to the Flash memory block upon receiving a read request.

FIG. 1 illustrates a network architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, laptop computer, handheld computer, printer, and/or any other type of logic-containing device. It should be noted that a user device 111 may also be directly coupled to any of the networks, in some embodiments.

A peripheral 120 or series of peripherals 120, e.g., facsimile machines, printers, scanners, hard disk drives, networked and/or local data storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 2:
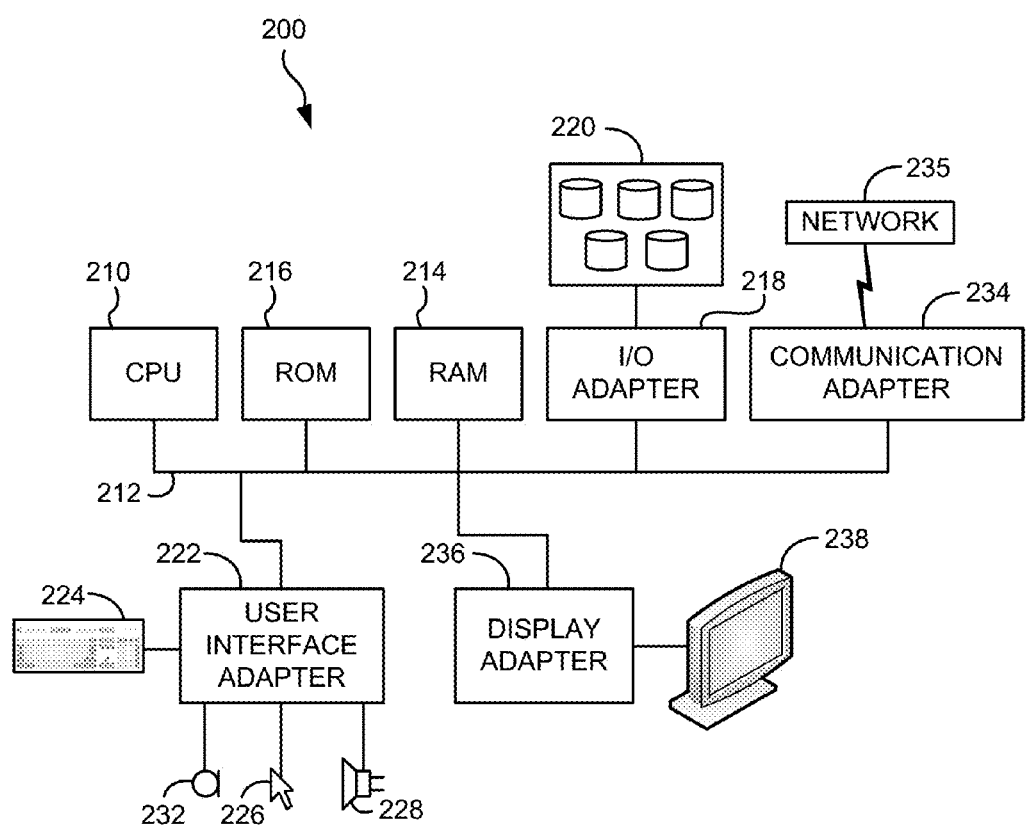
FIG. 2 shows a representative hardware environment of a processor system that may be associated with the servers and/or clients of FIG. 1, in accordance with one embodiment.

FIG. 2 shows a representative hardware environment associated with a user device 116 and/or server 114 of FIG. 1, in accordance with one embodiment. FIG. 2 illustrates a typical hardware configuration of a processor system 200 having a central processing unit 210, such as a microprocessor, and a number of other units interconnected via a system bus 212, according to one embodiment.

The processor system 200 shown in FIG. 2 includes a Random Access Memory (RAM) 214, Read Only Memory (ROM) 216, an I/O adapter 218 for connecting peripheral devices such as storage subsystem 220 to the bus 212, a user interface adapter 222 for connecting a keyboard 224, a mouse 226, a speaker 228, a microphone 232, and/or other user interface devices such as a touch screen, a digital camera (not shown), etc., to the bus 212, communication adapter 234 for connecting the processor system 200 to a communication network 235 (e.g., a data processing network) and a display adapter 236 for connecting the bus 212 to a display device 238.

The processor system 200 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 3:
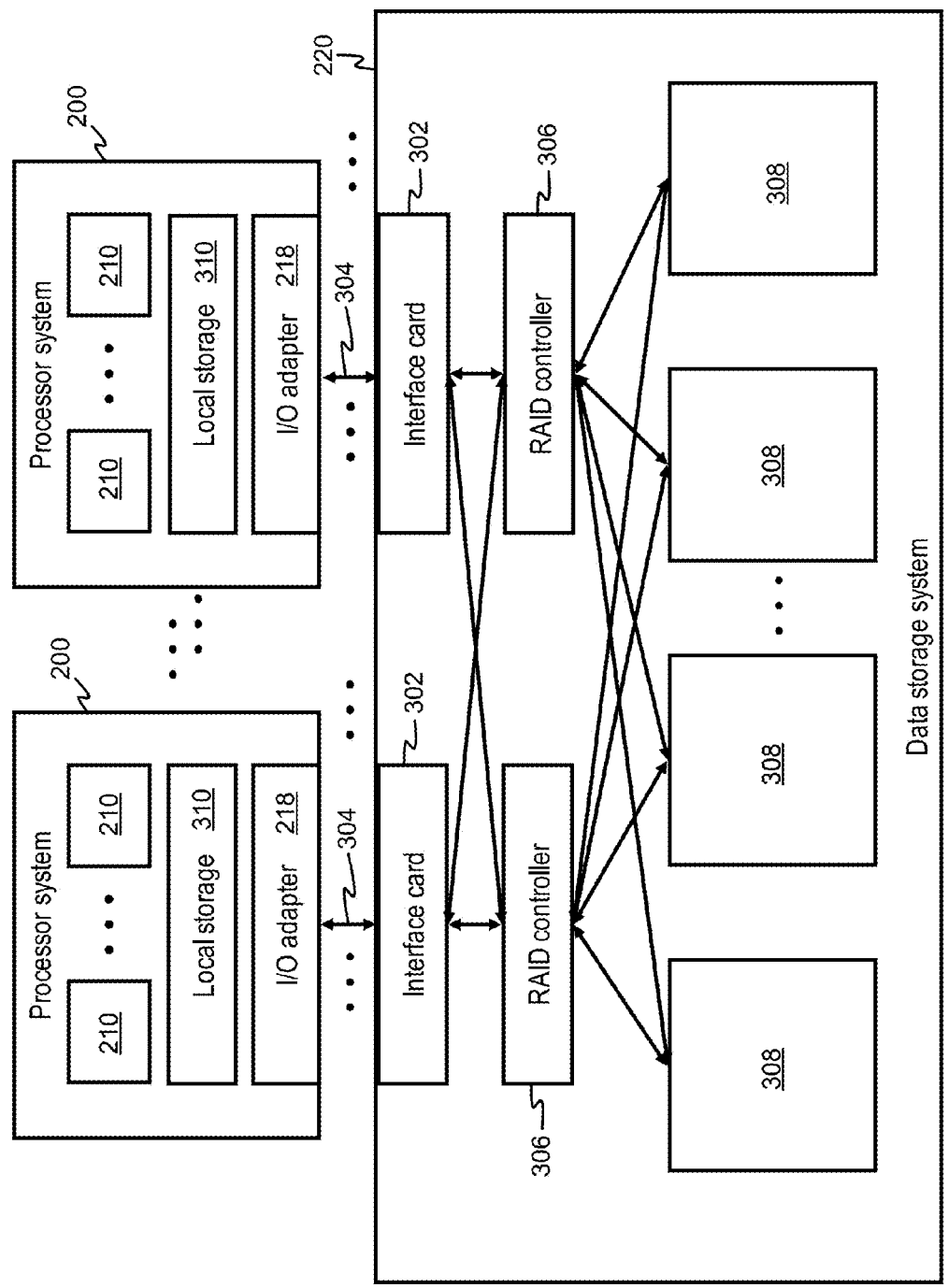
FIG. 3 shows a data storage system architecture in one embodiment.

Now referring to FIG. 3, a data storage system 220 architecture is shown according to one embodiment. The data storage system 220 comprises a number of interface cards 302 configured to communicate via I/O interconnections 304 to one or more processor systems 200. The data storage system 220 may also comprise one or more RAID controllers 306 configured to control data storage in a plurality of non-volatile data storage cards 308. The non-volatile data storage cards 308 may comprise Flash memory cards, RAM, ROM, and/or some other known type of non-volatile memory.

The I/O interconnections 304 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 306 in the data storage system 220 may perform a parity scheme similar to that employed by RAID-5, RAID-10, or some other suitable parity scheme, as would be understood by one of skill in the art upon reading the present descriptions.

Each processor system 200 comprises one or more processors 210 (such as CPUs, microprocessors, etc.), local data storage 310 (such as RAM 214, ROM 216, etc.), and an I/O adapter 218 configured to communicate with the data storage system 220.

Figure 4:
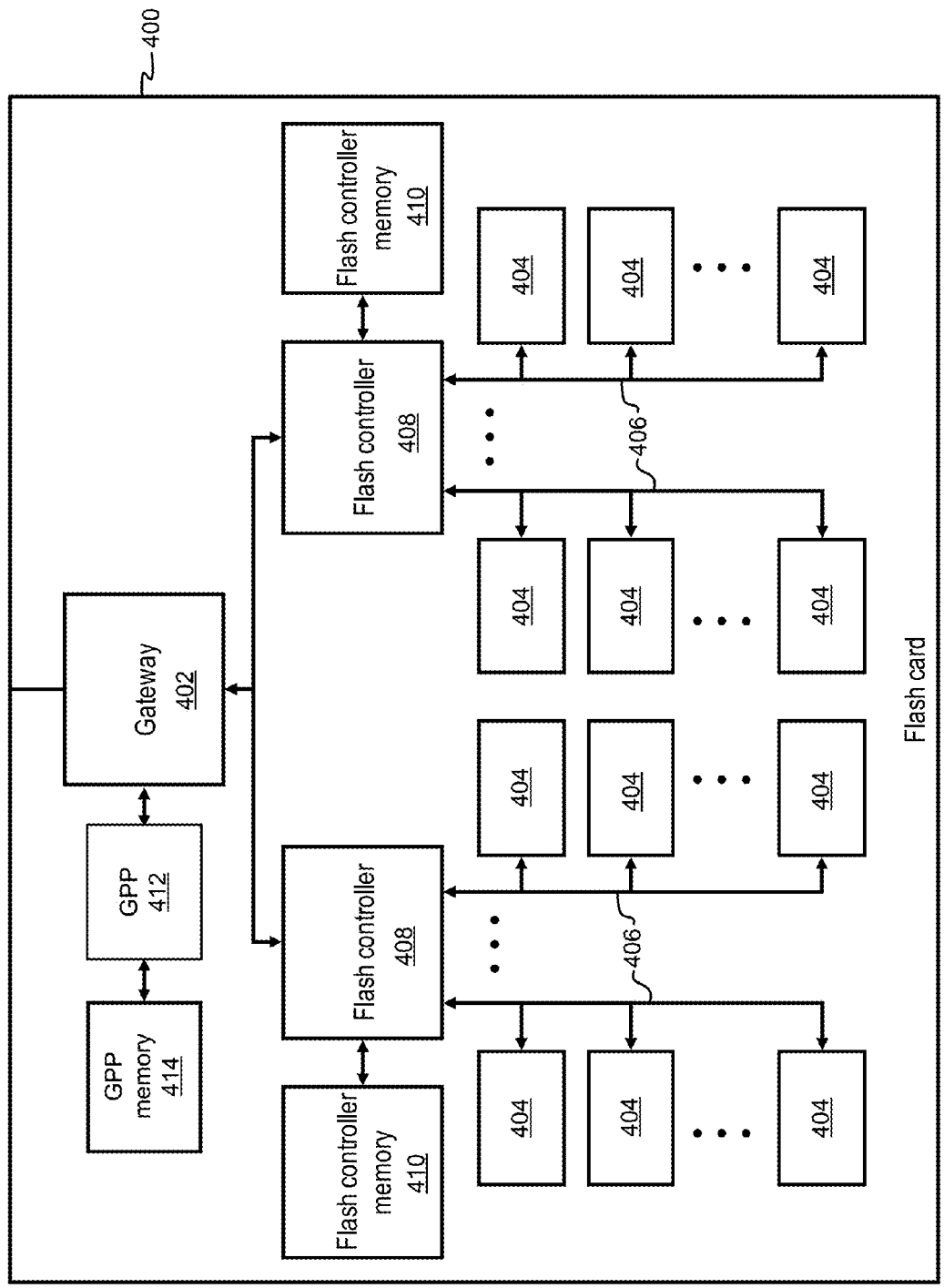
FIG. 4 shows a Flash memory card according to one embodiment.

In FIG. 4, a Flash card 400 is shown as an exemplary non-volatile data storage card according to one embodiment. Although other types of non-volatile data storage cards may be used in a data storage system, the Flash card 400 is shown as a non-limiting example. Each Flash card 400 comprises a gateway 402, a general purpose processor (GPP) 412 (such as an ASIC, FPGA, CPU, etc.) connected to a GPP memory 414 (which may comprise RAM, ROM, battery-backed DRAM, phase-change memory PC-RAM, MRAM, STT-MRAM, etc., or a combination thereof), and a number of Flash controllers 408. Each Flash controller 408 is connected to a plurality of Flash memory modules 404 (which may comprise NAND Flash or some other suitable Flash type known in the art) and a Flash controller memory 410 (which may be battery-backed DRAM, phase-change memory PC-RAM, MRAM, STT-MRAM, etc., or a combination thereof).

The Flash controllers 408 internally perform a parity scheme (similar to some RAID implementation such as RAID-5, RAID-10, etc.) to protect against chip/plane failures. In this parity scheme, erased Flash blocks from different channels are grouped together into a block stripe. This block stripe then builds a garbage collection unit. Garbage collection selects a block stripe according to a certain predetermined strategy and relocates all still valid data. Once all still valid data has been relocated, all blocks in the block stripe designated as garbage may be erased and put back into a pool of erased blocks from which new block stripes may be built later.

Figure 5:
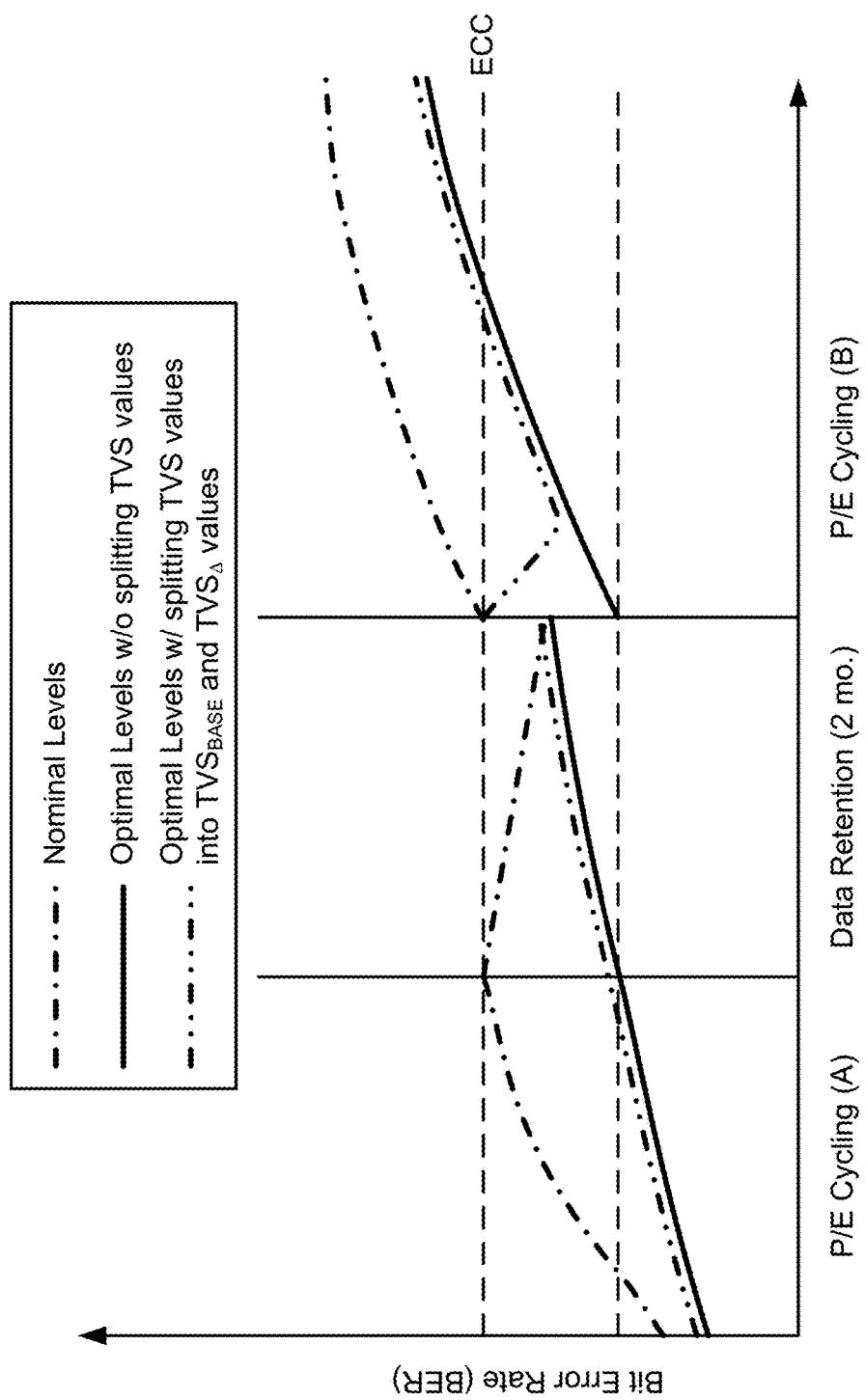
FIG. 5 is a chart showing tracking threshold voltage levels, according to one embodiment.

FIG. 5 shows a chart depicting typical behavior of the residual bit error rate (RBER) of a Flash memory block as a function of cycling and data retention. During data retention, optimal levels slowly shift back toward nominal levels. Using other threshold voltage shift algorithms known in the art, the levels are tracked as they shift downward, updating metadata accordingly.

Immediately after the Flash memory block is erased and re-programmed, the optimal levels suddenly shift back to close to levels present before the data retention and tracked levels in metadata are still close to nominal levels.

Until the Flash memory block is calibrated again, nominal performance is achieved and hence a higher RBER. In a worst case, the ECC correction capability may have already been exceeded.

When reading a NAND Flash page, one or more threshold voltage shift (TVS) values may be applied. Typically, the number of applicable TVS values depends on the number of bits stored in a single Flash cell and may be Flash chip vendor specific. For instance, Single Level Cell (SLC) may support a single TVS value, Multi-Level Cell (MLC) may store two bits per cell, three TVS values, or more. In one embodiment, each threshold voltage shift (TVS) value may be split into two parts, a $TVS_{BASE}$ which is configured to store the base threshold voltage shift value, and a $TVS_\Delta$ which is configured to store one or more delta threshold voltage shift values. In this way, $-\Delta V = TVS_{BASE} + TVS_\Delta$. These TVS values are tracked on a per page, per page group, or per block basis.

Optimally, every page in a Flash memory block may have its own TVS values. However, to reduce the amount of metadata used to store the TVS values, physical Flash pages which typically have similar TVS values may be grouped together in one embodiment. In a preferred embodiment, the TVS values may be tracked on a per page group basis, where pages are grouped according to Flash characterization data and/or known internal architecture of NAND Flash blocks. This approach exhibits a superior performance and metadata overhead tradeoff. Note that the number of page groups and which page belongs to which group may be fixed for a particular NAND Flash device type. Also, the number of pages in each page group may vary from group to group depending on the device type. Alternatively, $TVS_{BASE}$ values may be used per page group, and the $TVS_\Delta$ values may be used per Flash memory block to further restrict resource usage, in one embodiment.

The threshold voltage shift values $TVS_{BASE}$ and $TVS_\Delta$ may be stored in the Flash controller memory (which may be DRAM) or some other suitable memory type known in the art.

The grouping of pages into TVS page groups may be performed based on characterization data and/or the known internal architecture of NAND Flash blocks and may further be fixed for a particular Flash type. In one embodiment, a controller may support up to 16 page groups or more, with each page group holding up to 16 physical Flash pages, or more, with each Flash block size being 256 pages, or more or less.

When $TVS_{BASE}$ and the $TVS_\Delta$ values are tracked per page group, each page group may include 3×14-bit shift values, or more or less, in various other approaches. The 14-bit values may be split into a 7-bit $TVS_{BASE}$ value and a 7-bit $TVS_\Delta$ value in one embodiment. In another embodiment, which further reduces the amount of meta-data, only 3×9 bits per page group are used to store the shift values. The 9-bit values may then be split into a 5-bit $TVS_{BASE}$ value and a 4-bit $TVS_\Delta$ value.

In another embodiment, an amount of metadata per Flash memory block may include 16 page groups with either a 3×7-bit shift value per page group, or a 2×7-bit shift value per page group. Of course, other sizes of shift values may be used per page group, and more or less than 16 page groups may be included, in various other approaches. The 7-bit shift value may be split into: a 4-bit base shift value ($TVS_{BASE}$), and a 3-bit delta shift value ($TVS_\Delta$). The read voltage shift values to be configured in the Flash chip prior to a read operation might be Flash chip vendor specific. In one embodiment, it may be a 7-bit signed integer value. In order to scale the limited range of $TVS_{BASE}$ and $TVS_\Delta$ values to cover a range of read voltage shift values that are configured in the Flash chips, a mapping from the value of the base/delta shifts to the actual read voltages shifts may be used. One exemplary mapping is shown in Table 1, below.

TABLE 1

| $TVS_{BASE}$ | Base Mapping | $TVS_\Delta$ | ΔMapping |
|---|---|---|---|
| 0000 | −12 | 000 | −15 |
| 0001 | −9 | 001 | −12 |
| 0010 | −6 | 010 | −9 |
| 0011 | −3 | 011 | −6 |
| 0100 | 0 | 100 | −3 |
| 0101 | +3 | 101 | 0 |
| 0110 | +6 | 110 | +3 |
| 0111 | +9 | 111 | +6 |
| 1000 | +12 | | |
| 1001 | +15 | | |
| 1010 | +18 | | |
| 1011 | +21 | | |
| 1100 | +24 | | |
| 1101 | +27 | | |
| 1110 | +30 | | |
| 1111 | +33 | | |

Furthermore, a few extra bits (2-3 bits) may be included in the shift values to allow for expanded representation of values, in further approaches. Of course, the values for the mapping may be different than those shown in the exemplary mapping of Table 1, as would be understood by one of skill in the art.

Flash cards typically check the health of its Flash memory periodically by a background health checker which performs health check functions, such as read scrubbing, to determine if data is still readable, and block calibration to determine optimal TVS values. The background health checker traverses the entire occupied Flash space within a well-defined time interval. Full calibration is not required to be executed on every background health check iteration when using the method to update TVS values described herein. To reduce the read workload, calibration may be only executed every 2-3 background health check runs (which equates to approximately every 1-3 weeks), unless a block is marked explicitly for a required calibration, by a user or during an automated process which detects some condition that indicates calibration is required.

The calibration process requires each physical Flash page to be read 3 times, or more or less, with different TVS values used in each read. Based on results of the read operations, new TVS values may be chosen and a number of errors for optimal values may be output and/or returned.

Optimally, calibration of the $TVS_{BASE}$ value is performed shortly after the Flash memory block has been written and has only experienced a small number of reads. By shortly, what is meant is within a reasonable amount of time after the writing, without interfering with normal operation of the Flash memory block, such as reads and writes. Therefore, if the calibration may be performed immediately after the writing when the programmed values have reached a stable state, then it is. Otherwise, it is performed at a first available time after the writing without interrupting normal operations. In this way, the calibration process does not affect system performance in any way. Therefore, calibration may be executed as part of the background health check process.

Figure 6:
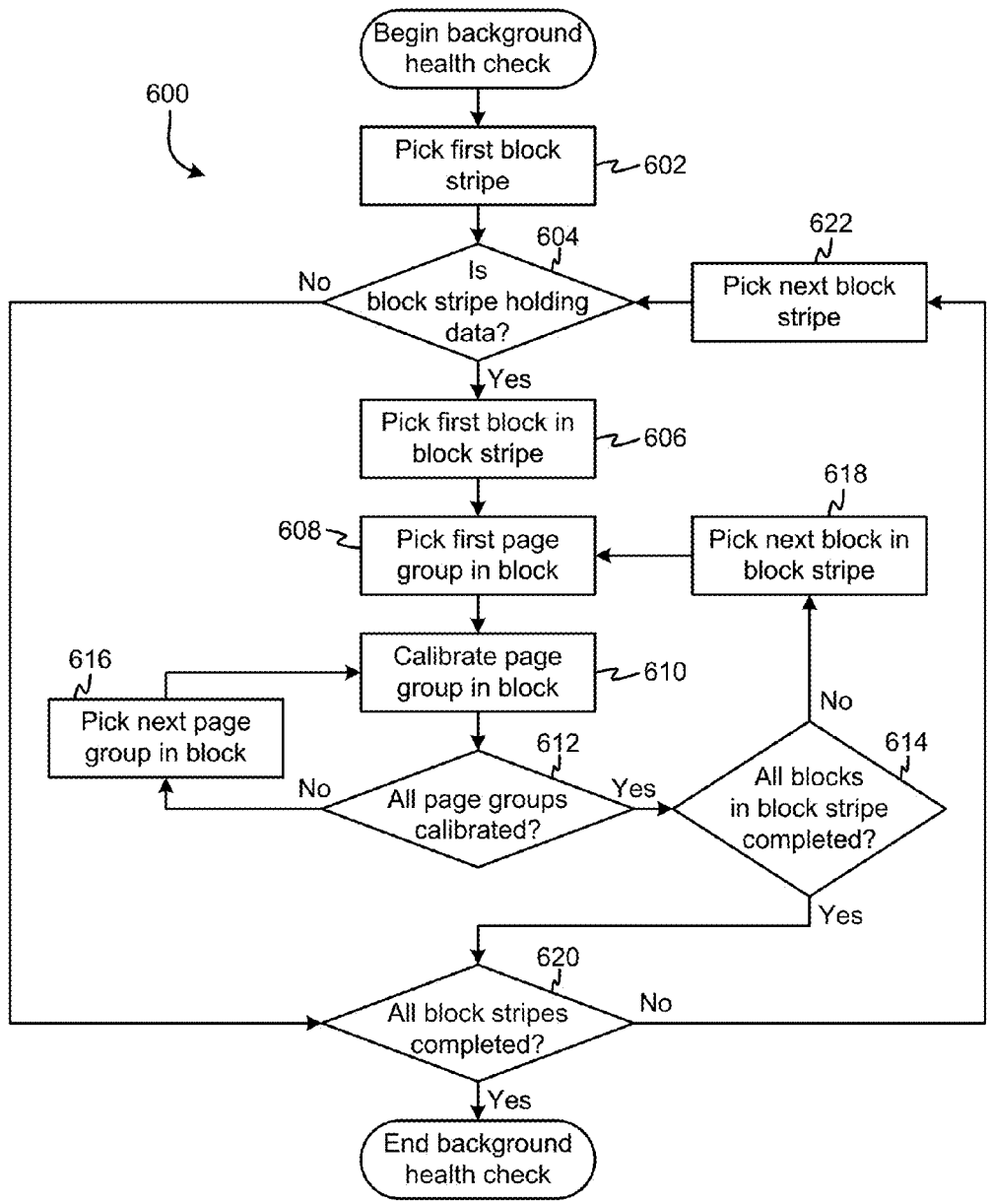
FIG. 6 shows a flowchart of a method for performing a background health check, according to one embodiment.

Now referring to FIG. 6, a method 600 is shown for executing a background health check according to one embodiment. In operation 602, a first block stripe is picked from block stripes stored to Flash memory. Any block stripe may be chosen, and the determination as to which block stripe to choose may be based on any factor or considerations, such as order, name, etc.

In operation 604, it is determined whether the block stripe holds data. Any method of making such a determination known in the art may be used. When the block stripe holds data, method 600 continues to operation 606; otherwise, method 600 jumps to operation 620.

In operation 606, a first block in the block stripe is picked. Any method to pick a first block known in the art may be used, and the picking may be based on any factor, such as order, name, etc.

In operation 608, a first page group in the block is picked. Any method to pick a first page group known in the art may be used, and the picking may be based on any factor, such as order, name, contents, etc.

In operation 610, the page group is calibrated in the block, using any calibration technique described herein, in various embodiments (such as those in FIGS. 7-9) and others not specifically described herein but known in the art. At the beginning of the lifetime of a data storage system, page groups will not yet be calibrated. It will be understood by those skilled in the art that nominal TVS values may be used, i.e., $TVS_{BASE}$ may be set to the nominal TVS value and $TVS_\Delta$ may be set to zero.

With continued reference to FIG. 6, in operation 612, it is determined whether all page groups in the block have been calibrated. Any method of making such a determination known in the art may be used. When all page groups in the block have been calibrated, method 600 continues to operation 614; otherwise, method 600 returns to operation 616 where a next page group from the block is picked.

In operation 614, it is determined whether all blocks in the block stripe have been completed (e.g., all page groups within all blocks of the block stripe have been calibrated). Any method of making such a determination known in the art may be used. When all blocks in the block stripe have been completed, method 600 continues to operation 620; otherwise, method 600 returns to operation 618 to pick a next block in the block stripe. Any technique for picking a next block may be used as known in the art, and may be based on order, name, contents, etc.

In operation 620, it is determined whether all block stripes have been completed (e.g., all page groups within all blocks within all block stripes have been calibrated). Any method of making such a determination known in the art may be used. When all block stripes have been completed, method 600 ends; otherwise, method 600 returns to operation 622 to pick a next block stripe. Any technique for picking a next block stripe may be used as known in the art, and may be based on order, name, contents, etc. As with the other logical flowcharts presented herein, operations are presented in logical rather than strictly chronological order, and in some embodiments, operations may be performed in a different order than presented, or concurrently. For instance, processing of a page group index may be performed concurrently in all blocks of the block stripe.

Referring again to FIG. 4, there are three input variables that may be used to determine how the threshold voltage shift values are calibrated:

1) Sweep counter—a value which indicates a number of background health check sweeps a Flash memory block stripe has experienced since it has last been built. This value may be maintained per block stripe in the GPP memory 414, a DRAM memory, or some other suitable memory type known in the art attached to the GPP 412 of the Flash card 400.

2) Read disturb count—a value which indicates, on a per-block or per-page group basis, a number of times a Flash memory block or page group has been read. This value may be stored in the block parameter table in the Flash controller memory 410, a DRAM memory, or some other suitable memory type known in the art attached to the Flash controller 408.

3) $PE_{LC}$—a value which indicates the program erase (P/E) cycle count of the Flash memory block since a last calibration. This value may be stored in the block parameter table in the Flash controller memory 410.

Table 2, below, shows how $TVS_{BASE}$ and $TVS_\Delta$ may be updated during block calibration based on the read disturb count, the sweep count, and the P/E cycle count. These embodiments are also described in FIGS. 7-9.

TABLE 2

| Sweep Count | Read Count | |
|---|---|---|
| | Low | High |
| 0 | Calibrate $TVS_{BASE}$, Reset $TVS_\Delta$ | $PE_{LC} < 500$: Calibrate $TVS_\Delta$ $PE_{LC} \geq 500$: Calibrate $TVS_{BASE}$ and $TVS_\Delta$ -- or -- Calibrate $TVS_\Delta$ only and mark block for later calibration |
| >0 | Calibrate $TVS_\Delta$ | Calibrate $TVS_\Delta$ |

The $TVS_\Delta$ may be reset upon a Flash memory block erasure, whereas the $TVS_{BASE}$ may remain untouched upon a Flash memory block erasure operation. Clearly, in a first approximation, a calculation may be based on the sweep count value of a Flash memory block, SWP(blk), in the following manner:

1) When SWP(blk)>0: perturb $TVS_\Delta \pm \varepsilon$ and update metadata accordingly;
2) When SWP(blk)=0: perturb $TVS_{BASE} \pm \varepsilon$ and update metadata accordingly.

Figure 7:
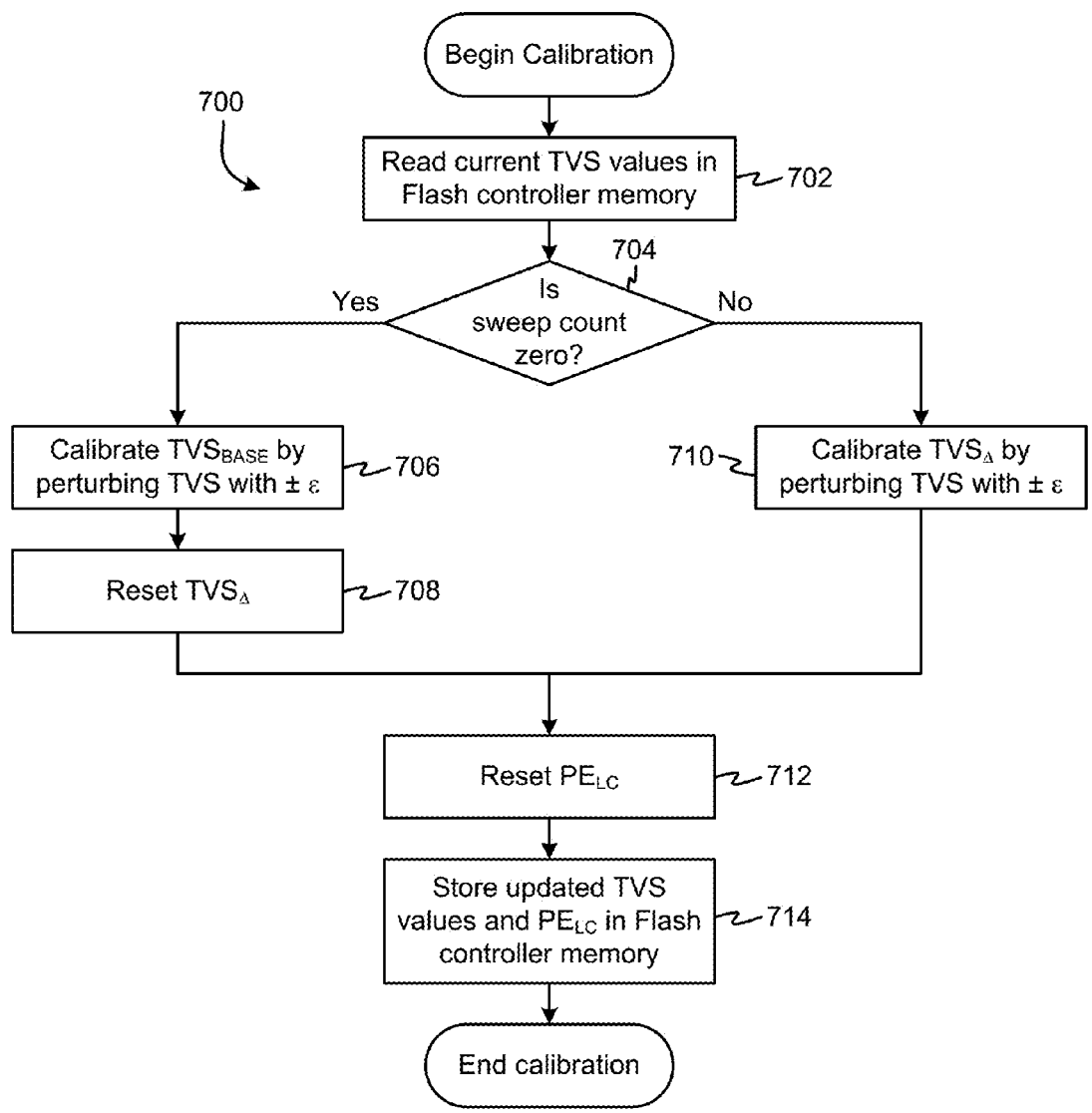
FIG. 7 shows a flowchart of a method for calibrating a background health check, according to one embodiment.

This calibration is described in FIG. 7 in more detail, according to one embodiment. With reference to FIG. 7, a method 700 is shown for calibrating a page group according to one embodiment. In operation 702, current TVS value(s) are read in the Flash controller memory. Any number of TVS values may be read, when more than one is stored, with each TVS value possibly having a different function and/or association with a different page group.

In operation 704, it is determined whether a sweep count is zero. The sweep count is a value which indicates a number of background health check sweeps that have occurred for particular data, typically a particular block stripe. When the sweep count is zero, method 700 continues to operation 706; otherwise, when the sweep count is greater than zero, method 700 continues to operation 710.

In operation 706, a $TVS_{BASE}$ value is calibrated by perturbing the read TVS value with $\pm \varepsilon$. Any method to perturb the TVS value may be used, and any number of iterations may be performed before determining a calibrated $TVS_{BASE}$ value.

In operation 708, a $TVS_\Delta$ value is reset back to a nominal starting value, such as zero.

In operation 710, the $TVS_\Delta$ value is calibrated by perturbing the read TVS value with $\pm \varepsilon$. Any method to perturb the TVS value may be used, and any number of iterations may be performed before determining a calibrated $TVS_\Delta$ value.

In operation 712, a $PE_{LC}$ is reset to a nominal starting value, such as zero.

In operation 714, the updated TVS values ($TVS_{BASE}$ and $TVS_\Delta$) and the $PE_{LC}$ are stored in the Flash controller memory.

In another embodiment, a block may be marked for later recalibration when $PE_{LC}$ exceeds a certain predetermined threshold. In yet another embodiment, the number of calibrations may be reduced further by postponing calibration when the PE count or $PE_{LC}$ is lower than certain predetermined thresholds.

Figure 8:
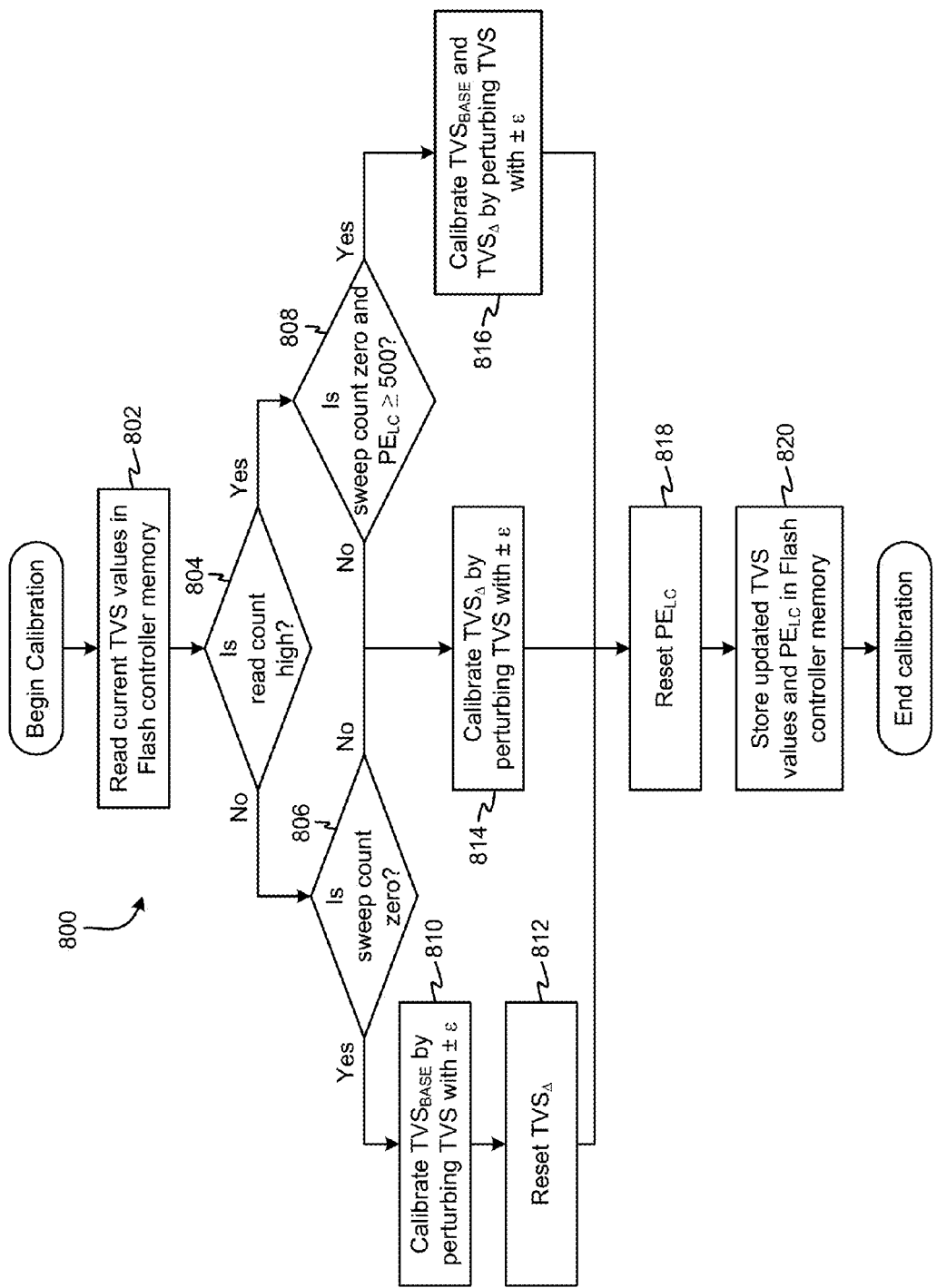
FIG. 8 shows a flowchart of a method for calibrating a background health check, according to another embodiment.

With reference to FIG. 8, a method 800 is shown for calibrating a page group according to another embodiment. In operation 802, current TVS value(s) are read in the Flash controller memory. Any number of TVS values may be read, when more than one is stored, with each TVS value possibly having a different function and/or association with a different page group.

In operation 804, it is determined whether a read count is high. The read count may be determined to be high based on a comparison to normal read counts, average read counts, some threshold read count, etc. When the read count is high, method 800 continues to operation 808; otherwise, method 800 continues to operation 806.

In operation 806, it is determined whether a sweep count is zero. The sweep count is a value which indicates a number of background health check sweeps that have occurred for particular data, typically a particular block stripe. When the sweep count is zero, method 800 continues to operation 810; otherwise, when the sweep count is greater than zero, method 800 continues to operation 814.

In operation 808, it is determined whether the sweep count is zero and the $PE_{LC}$ is greater than or equal to some threshold (e.g., 500 as shown in FIG. 8). When the sweep count is zero and the $PE_{LC}$ is greater than or equal to the threshold, method 800 continues to operation 816; otherwise, method 800 continues to operation 814.

In operation 810, a $TVS_{BASE}$ value is calibrated by perturbing the read TVS value with ±ε. Any method to perturb the TVS value may be used, and any number of iterations may be performed before determining a calibrated $TVS_{BASE}$ value. Method 800 then continues to operation 812.

In operation 812, a $TVS_\Delta$ value is reset back to a nominal starting value, such as zero. Method 800 then continues to operation 818 as is described below.

In operation 814, a $TVS_\Delta$ value is calibrated by perturbing the read TVS value with ±ε. Any method to perturb the TVS value may be used, and any number of iterations may be performed before determining a calibrated $TVS_\Delta$ value. Method 800 then continues to operation 818.

In operation 816, both the $TVS_{BASE}$ value and the $TVS_\Delta$ value are calibrated by perturbing the read TVS value with ±ε. Any method to perturb the TVS value may be used, and any number of iterations may be performed before determining a calibrated $TVS_{BASE}$ value and $TVS_\Delta$ value. Method 800 then continues to operation 818.

In operation 818, a $PE_{LC}$ is reset to a nominal starting value, such as zero.

In operation 820, the updated TVS values ($TVS_{BASE}$ and $TVS_\Delta$) and the $PE_{LC}$ are stored in the Flash controller memory.

Figure 9:
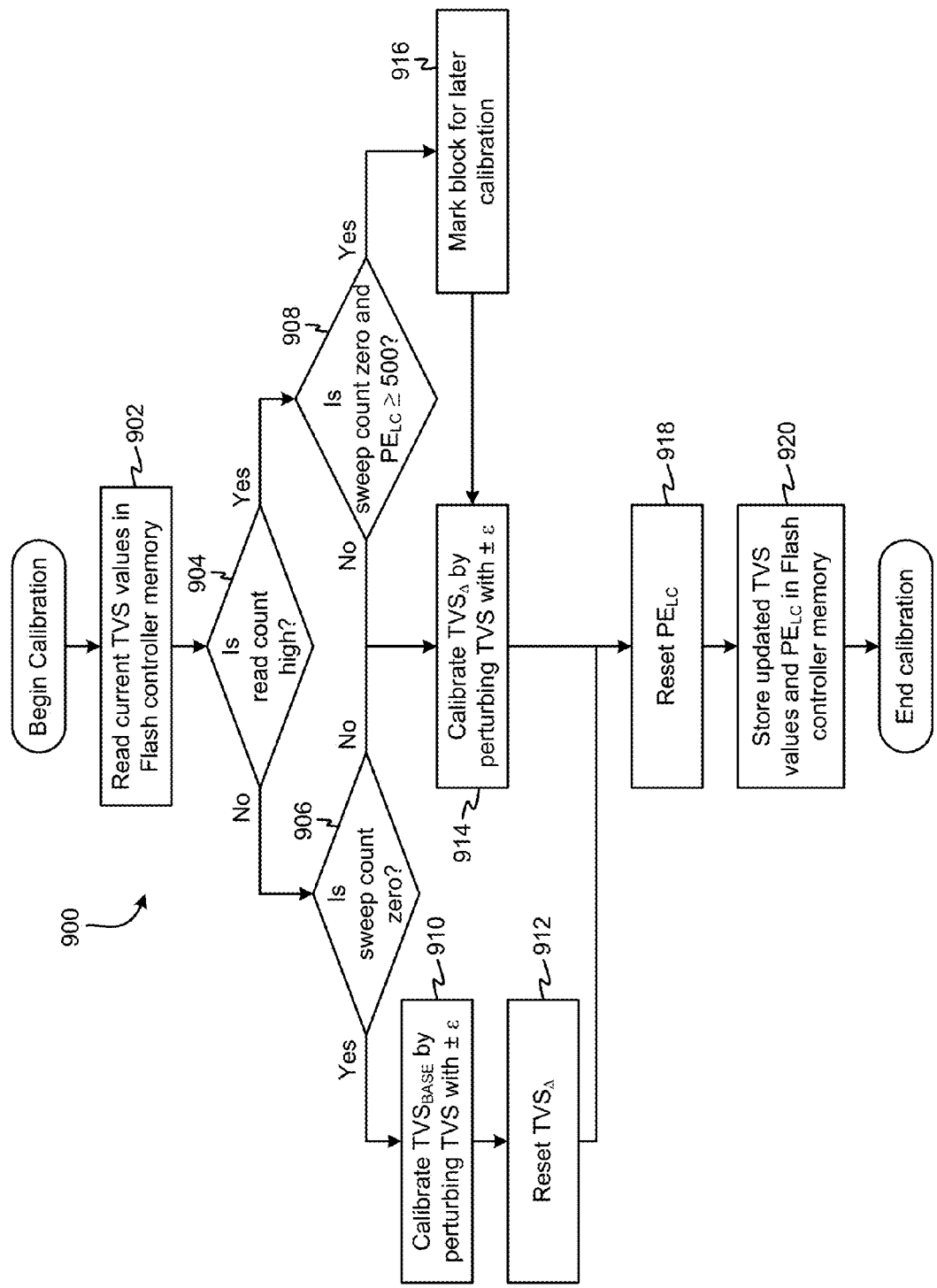
FIG. 9 shows a flowchart of a method for calibrating a background health check, according to yet another embodiment.

With reference to FIG. 9, a method 900 is shown for calibrating a page group according to yet another embodiment. In operation 902, current TVS value(s) are read in the Flash controller memory. Any number of TVS values may be read, when more than one is stored, with each TVS value possibly having a different function and/or association with a different page group.

In operation 904, it is determined whether a read count is high. The read count may be determined to be high based on a comparison to normal read counts, average read counts, some threshold read count, etc. When the read count is high, method 900 continues to operation 908; otherwise, method 900 continues to operation 906.

In operation 906, it is determined whether a sweep count is zero. The sweep count is a value which indicates a number of background health check sweeps that have occurred for particular data, typically a particular block stripe. When the sweep count is zero, method 900 continues to operation 910; otherwise, when the sweep count is greater than zero, method 900 continues to operation 914.

In operation 908, it is determined whether the sweep count is zero and the $PE_{LC}$ is greater than or equal to some threshold (500 as shown in FIG. 9, but any positive number may be used). When the sweep count is zero and the $PE_{LC}$ is greater than or equal to the threshold, method 900 continues to operation 916; otherwise, method 900 continues to operation 914.

In operation 910, a $TVS_{BASE}$ value is calibrated by perturbing the read TVS value with ±ε. Any method to perturb the TVS value may be used, and any number of iterations may be performed before determining a calibrated $TVS_{BASE}$ value. Method 900 then continues to operation 912.

In operation 912, a $TVS_\Delta$ value is reset back to a nominal starting value, such as zero. Method 900 then continues to operation 918.

In operation 914, a $TVS_\Delta$ value is calibrated by perturbing the read TVS value with ±ε. Any method to perturb the TVS value may be used, and any number of iterations may be performed before determining a calibrated $TVS_\Delta$ value. Method 900 then continues to operation 918.

In operation 916, the block is marked (such as with a flag bit or some other indicator) to calibrate at a later time and the method continues to operation 914.

In operation 918, a $PE_{LC}$ is reset to a nominal starting value, such as zero. Method 900 then continues to operation 920.

In operation 920, the updated TVS values ($TVS_{BASE}$ and $TVS_\Delta$) and the $PE_{LC}$ are stored in the Flash controller memory and method 900 ends.

Pseudo-code, in one exemplary embodiment, is presented below to illustrate how the split level shifting may be implemented. Alterations, additions, subtractions, and modifications to this pseudo-code for actual implementation and/or to affect desired tweaks and changes to the functionality are possible, and are not excluded from the embodiments described herein, as would be apparent to one of skill in the art upon reading the present descriptions. In this pseudo-code, $\Delta BASE_{A/B/C}$ is the $TVS_{BASE}$, $\Delta TEMP_{A/B/C}$ is the $TVS_\Delta$, SWP(blk) is the sweep counter of the block which typically is maintained as a single sweep count value in the block stripe for all blocks in this block stripe, baseMap( ) and tempMap( ) are the delta-voltage mappings, grpWL (numGrps) is the word line grouping,

```
INPUTS: ΔBASE_{A/B/C} (numBlks,numGrps), ΔTEMP_{A/B/C} (numBlks,numGrps),
SWP(blk)
OUTPUTS: ΔBASE_{A/B/C} (numBlks,numGrps), ΔTEMP_{A/B/C} (numBlks,numGrps)
PARAM: baseMap(16), tempMap(8), grpWL(numGrps)
FOR blk=1:numBlks
   FOR grp=1:numGrps
      % Generate candidate read voltages
      IF(SWP(blk)>0)
         ΔCAND_{A/B/C} = (ΔBASE_{A/B/C}(blk,grp)+[-1 0 +1], ΔTEMP_{A/B/C}(blk,grp)      )
      ELSE
         ΔCAND_{A/B/C} = (ΔBASE_{A/B/C}(blk,grp)       , ΔTEMP_{A/B/C}(blk,grp)+[-1 0 +1])
      END
      % Count number of A/B/C errors for each candidate for every WL in group
      FOR k = 1:3
         FOR wl = grpWL(grp)
            % Compute voltage shifts using delta-voltage mapping
            useShift_{A/B/C}=baseMap(ΔCAND_{A/B/C}(k,1))+tempMap(ΔCAND_{A/B/C}(k,2))
            % Read, decode and count number of A/B/C errors
            numErr_{A/B/C}(k,wl) = Read-Decode-Compare(blk, wl, useShift_{A/B/C})
         END
         % Maximum number of errors for this candidate (from all WL in group)
         errWorst_{A/B/C}(k) = max(numErr_{A/B/C}(k,:))
      END
      % Choose best candidate for this group
      [minWorst_{A/B/C} minInd_{A/B/C}] = min(errWorst_{A/B/C})
      % Update meta-data tables
      ΔBASE_{A/B/C}(blk,grp) = ΔCAND_{A/B/C}(minInd_{A/B/C},1)
      ΔTEMP_{A/B/C}(blk,grp) = ΔCAND_{A/B/C}(minInd_{A/B/C},2)
   END
END
```

According to testing performed using the split shift values described herein in various embodiments, endurance and data retention with respect to the RBER was significantly improved, particularly after extensive cycling of a Flash memory block and after prolonged data retention. Also, tracking is resilient to read disturbs (even those that may occur between background health check cycles), and the read disturb does not have a dramatic effect on optimal levels.

In one embodiment, an apparatus (such as a storage controller) may comprise and/or have access to a Flash memory block and a processor and logic integrated with and/or executable by the processor. The logic may be configured to perform the following steps in the background: read the current $TVS_{BASE}$ and/or $TVS_\Delta$ values from the Flash controller memory, determine, after an initial writing of data to the Flash memory block, a $TVS_{BASE}$ value configured to track permanent changes in an underlying threshold voltage distributions due to cycling of the Flash memory block, determine, after the initial writing of data to the Flash memory block, a $TVS_\Delta$ value configured to track temporary changes, with respect the underlying threshold voltage distribution changes due to retention and/or read disturb errors, store the $TVS_{BASE}$ value and the $TVS_\Delta$ value to the Flash controller memory, and calculate an overall threshold voltage shift value for the Flash memory block which equals a sum of the $TVS_{BASE}$ value and the $TVS_\Delta$ value to be used when writing data to the Flash memory block.

Figure 10:
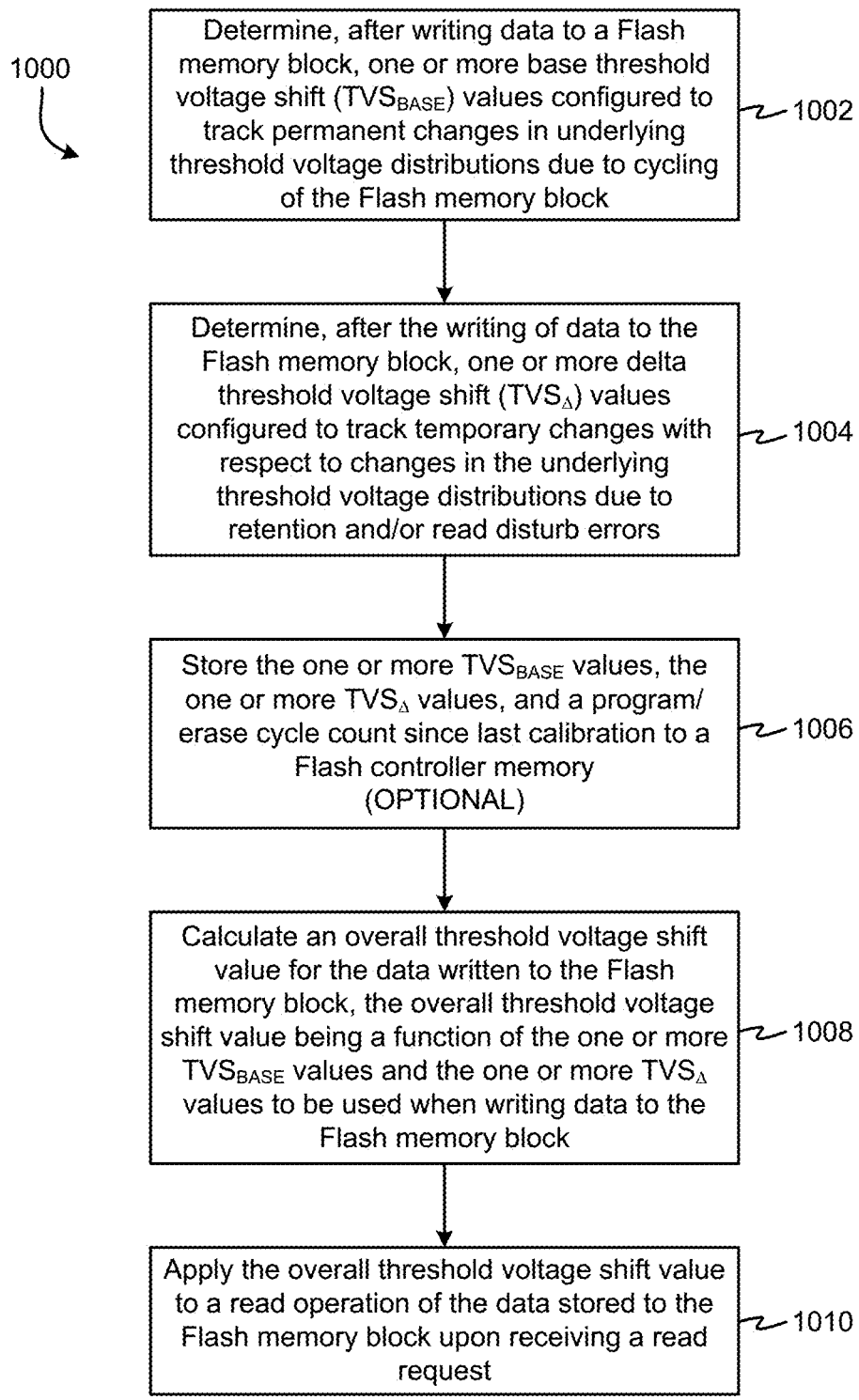
FIG. 10 shows a flowchart of a method, according to one embodiment.

Now referring to FIG. 10, a method 1000 is shown according to one embodiment. The method 1000 may be performed in accordance with the present invention in any of the environments depicted in FIGS. 1-9, among others, in various embodiments. Of course, more or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, the method 1000 may be partially or entirely performed by a processor (such as a CPU, an ASIC, an FPGA, etc.), a module, a function block, a switch, a router, etc., in various approaches.

As shown in FIG. 10, method 1000 may initiate with operation 1002, where, after writing data to a Flash memory block, one or more $TVS_{BASE}$ values are determined. Each $TVS_{BASE}$ value is configured to track permanent changes in underlying threshold voltage distributions due to cycling of the Flash memory block.

In operation 1004, after the writing of data to the Flash memory block, one or more $TVS_\Delta$ values are determined. Each $TVS_\Delta$ value is configured to track temporary changes with respect to changes in the underlying threshold voltage distributions due to retention and/or read disturb errors.

In optional operation 1006, the $TVS_{BASE}$ value, the $TVS_\Delta$ value, and the $PE_{LC}$ are stored, such as to a Flash controller memory or some other suitable memory of a type known in the art connected to a Flash controller.

In operation 1008, an overall threshold voltage shift (TVS) value for data written to the Flash memory block is calculated. In this embodiment, the overall TVS value may be a function of the $TVS_{BASE}$ value and the $TVS_\Delta$ value, and the overall TVS value may be used when writing data to the Flash memory block. In one embodiment, the overall TVS value may equal a sum of the $TVS_{BASE}$ value and the $TVS_\Delta$ value.

In operation 1010, the overall TVS value is applied to a read operation of the data stored to the Flash memory block upon receiving a read request for such data.

In one approach, method 1000 may further include resetting the $TVS_\Delta$ value when the Flash memory block is erased. Furthermore, both the $TVS_{BASE}$ value and the $TVS_\Delta$ value may be reset and re-determined during a background health check after a predetermined number of background health checks without calibration are performed. In one embodiment, the predetermined number of background health checks without calibration may be from 0 to 5, such as 2.

In a further embodiment, a block may be marked for later re-calibration when a program/erase (P/E) cycle count exceeds a predetermined threshold. The predetermined threshold for the P/E cycle count may be 500, or more or less, in some approaches. In yet another embodiment, the number of calibrations may be reduced further by postponing calibration when the PE count or $PE_{LC}$ is lower than certain predetermined thresholds.

In this embodiment, the $TVS_{BASE}$ value and the $TVS_A$ value may be determined without interrupting normal operations directed at the Flash memory block, normal operations including writing and/or reading of data to/from the Flash memory block.

Method 1000 may also include grouping together physical Flash pages which have similar $TVS_{BASE}$ and $TVS_A$ values into a page group, in order to reduce storage needs and in order to apply changes to the $TVS_{BASE}$ and $TVS_A$ values across all members of the group with less overhead.

In this approach, the $TVS_{BASE}$ value may be stored using from 3 to 7 bit-length values, the $TVS_A$ value may be stored using from 2 to 6 bit-length values, and the $TVS_{BASE}$ and $TVS_A$ values may be tracked per page group using from 5 to 11 bit-length values. Of course, more or less bits may be used for storing the TVS values, as would be appreciated by one of skill in the art upon reading the present descriptions.

Furthermore, a mapping may be created that correlates the $TVS_{BASE}$ and $TVS_A$ values as tracked per page group to actual read voltage shift values. In this way, the voltage applied to the Flash memory block in order to read and/or write may be calculated, as the TVS values are stored as simple short bit strings and do not actually have a voltage number stored. To get the voltage shift appropriate for a specific TVS value, the mapping may be consulted.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A computer program product, the computer program product comprising a computer readable storage medium having program instructions embodied therewith, wherein the computer readable storage medium is not a transitory signal per se, the program instructions executable by a processing circuit to cause the processing circuit to perform a method comprising:
   determining, by the processing circuit, after writing data to a non-volatile memory block, one or more delta threshold voltage shift ($TVS_A$) values configured to track temporary changes with respect to changes in the underlying threshold voltage distributions due to retention and/or read disturb errors;
   calculating, by the processing circuit, one or more overall threshold voltage shift values for the data written to the non-volatile memory block, the one or more overall threshold voltage shift values being a function of the one or more $TVS_A$ values to be used when writing data to the non-volatile memory block;
   storing, by the processing circuit, the one or more overall threshold voltage shift values;
   reading, by the processing circuit, one or more TVS values from a non-volatile controller memory;
   resetting, by the processing circuit, a program/erase cycle count since last calibration after calibrating the one or more overall threshold voltage shift values; and
   storing, to the non-volatile controller memory, the one or more $TVS_A$ values and the program/erase cycle count since last calibration.

2. The computer program product as recited in claim 1, comprising program instructions for resetting the one or more $TVS_A$ values when the non-volatile memory block is erased.

3. The computer program product as recited in claim 1, comprising program instructions for applying the one or more overall threshold voltage shift values to a read operation of the data stored to the non-volatile memory block upon receiving a read request.

4. The computer program product as recited in claim 1, comprising program instructions for:
   reading one or more TVS values from a non-volatile controller memory;
   resetting a program/erase cycle count since last calibration after calibrating the one or more overall threshold voltage shift values; and
   storing the one or more $TVS_A$ values, and the program/erase cycle count since last calibration to the non-volatile controller memory.

5. A computer program product, the computer program product comprising a computer readable storage medium having program instructions embodied therewith, wherein the computer readable storage medium is not a transitory signal per se, the program instructions executable by a processing circuit to cause the processing circuit to perform a method comprising:
   determining, by the processing circuit, after writing data to a non-volatile memory block, one or more delta threshold voltage shift ($TVS_A$) values configured to track temporary changes with respect to changes in the underlying threshold voltage distributions due to retention and/or read disturb errors;
   calculating, by the processing circuit, one or more overall threshold voltage shift values for the data written to the non-volatile memory block, the one or more overall threshold voltage shift values being a function of the one or more $TVS_A$ values to be used when writing data to the non-volatile memory block; and
   storing, by the processing circuit, the one or more overall threshold voltage shift values; and
   grouping together, by the processing circuit, physical non-volatile pages which have similar $TVS_A$ values into a page group.

6. The computer program product as recited in claim 5, comprising program instructions for resetting the one or more $TVS_A$ values when the non-volatile memory block is erased.

7. The computer program product as recited in claim 5, comprising program instructions for applying the one or more overall threshold voltage shift values to a read operation of the data stored to the non-volatile memory block upon receiving a read request.

8. The computer program product as recited in claim 5, comprising program instructions for:
- reading one or more TVS values from a non-volatile controller memory;
- resetting a program/erase cycle count since last calibration after calibrating the one or more overall threshold voltage shift values; and
- storing the one or more $TVS_\Delta$ values and the program/erase cycle count since last calibration to the non-volatile controller memory.

9. The computer program product as recited in claim 5, wherein each overall threshold voltage shift value equals a sum of a corresponding base threshold voltage shift ($TVS_{BASE}$) value and a corresponding $TVS_\Delta$ value, the $TVS_{BASE}$ value configured to track permanent changes in underlying threshold voltage distributions due to cycling of the non-volatile memory block.

10. The computer program product as recited in claim 5, comprising program instructions for re-calibrating at least one value selected from a group consisting of: a base threshold voltage shift ($TVS_{BASE}$) value and the one or more $TVS_\Delta$ values during a background health check after a predetermined number of background health checks without calibration are performed.

11. The computer program product as recited in claim 10, wherein the predetermined number of background health checks without calibration is from 1 to 5.

12. The computer program product as recited in claim 11, wherein a block is marked for re-calibration when a program/erase cycle count since last calibration exceeds a predetermined threshold, wherein blocks marked for re-calibration are forced to be calibrated in a read sweep background health check, and wherein the blocks are unmarked after re-calibration is completed.

13. The computer program product as recited in claim 11, wherein the re-calibration is not performed when a program/erase cycle count is lower than a predetermined threshold.

14. The computer program product as recited in claim 5, wherein the one or more $TVS_\Delta$ values are determined periodically in the background without interrupting normal operations directed at the non-volatile memory block.

15. A computer program product, the computer program product comprising a computer readable storage medium having program instructions embodied therewith, wherein the computer readable storage medium is not a transitory signal per se, the program instructions executable by a processing circuit to cause the processing circuit to perform a method comprising:
- determining, by the processing circuit, after writing data to a non-volatile memory block, one or more delta threshold voltage shift ($TVS_\Delta$) values configured to track temporary changes with respect to changes in the underlying threshold voltage distributions due to retention and/or read disturb errors;
- calculating, by the processing circuit, one or more overall threshold voltage shift values for the data written to the non-volatile memory block, the one or more overall threshold voltage shift values being a function of the one or more $TVS_\Delta$ values to be used when writing data to the non-volatile memory block; and
- storing, by the processing circuit, the one or more overall threshold voltage shift values,
- wherein each overall threshold voltage shift value equals a sum of a corresponding base threshold voltage shift ($TVS_{BASE}$) value and a corresponding $TVS_\Delta$ value, the $TVS_{BASE}$ value being configured to track permanent changes in underlying threshold voltage distributions due to cycling of the non-volatile memory block.

* * * * *